US010186464B2

(12) United States Patent
Wu (10) Patent No.: US 10,186,464 B2
(45) Date of Patent: Jan. 22, 2019

(54) ARRAY SUBSTRATE MOTHERBOARD, ARRAY SUBSTRATE AND METHOD OF MANUFACTURING THE SAME, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Peng Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/523,807

(22) PCT Filed: Sep. 29, 2016

(86) PCT No.: PCT/CN2016/100765
§ 371 (c)(1),
(2) Date: May 2, 2017

(87) PCT Pub. No.: WO2017/113919
PCT Pub. Date: Jul. 6, 2017

(65) Prior Publication Data
US 2018/0294199 A1    Oct. 11, 2018

(30) Foreign Application Priority Data

Dec. 31, 2015    (CN) .......................... 2015 1 1029910

(51) Int. Cl.
*H01L 21/66*    (2006.01)
*H01L 23/58*    (2006.01)
(Continued)

(52) U.S. Cl.
CPC .......... *H01L 22/34* (2013.01); *G01R 31/2635* (2013.01); *H01L 21/67242* (2013.01); *H01L 23/5226* (2013.01); *H01L 27/124* (2013.01)

(58) Field of Classification Search
CPC ....................................................... H01L 22/34
(Continued)

(56) References Cited

U.S. PATENT DOCUMENTS 7,456,647 B2 *    11/2008    Jeon ........................ G09G 3/006
                                                            324/760.01
8,698,137 B2 *    4/2014    Yamazaki ........... H01L 27/0266
                                                            257/43
(Continued)

FOREIGN PATENT DOCUMENTS

| CN | 103412431 A | 11/2013 |
|----|-------------|---------|
| CN | 104464580 A | 3/2015  |
| CN | 105632958 A | 6/2016  |

OTHER PUBLICATIONS

International Search Report and Written Opinion, English Translation.
(Continued)

*Primary Examiner* — Calvin Lee
(74) *Attorney, Agent, or Firm* — Brooks Kushman P.C.

(57) ABSTRACT

An array substrate motherboard, an array substrate, a display device and a method of manufacturing an array substrate are provided. The array substrate motherboard includes a plurality of array regions and a plurality of testing line regions. Each array region includes a fan-out region, a display region and a sealant arrangement region.

19 Claims, 5 Drawing Sheets

(51) Int. Cl.
*H01L 27/12* (2006.01)
*H01L 23/522* (2006.01)
*H01L 21/67* (2006.01)
*G01R 31/26* (2014.01)

(58) Field of Classification Search
USPC .................................. 257/48; 438/10–18
See application file for complete search history.

(56) References Cited

U.S. PATENT DOCUMENTS

| | | | |
|---|---|---|---|
| 9,501,959 B2 * | 11/2016 | Kim ...................... | G09G 3/006 |
| 9,508,274 B2 * | 11/2016 | Ro ...................... | H01L 27/1251 |
| | | | 324/760 |
| 2014/0098005 A1 | 4/2014 | Kim et al. | |
| 2015/0084666 A1 | 3/2015 | Kim et al. | |

OTHER PUBLICATIONS

CN103412431A, English Abstract and Translation.
CN104464580A, English Abstract and U.S. Equivalent U.S. Pub. No. 2015/0084666.
CN105632958A, English Abstract and Translation.
International Search Report and Written Opinion for Application No. PCT/CN2016/100765, dated Jan. 5, 2017, 13 Pages.

* cited by examiner

ARRAY SUBSTRATE MOTHERBOARD, ARRAY SUBSTRATE AND METHOD OF MANUFACTURING THE SAME, AND DISPLAY DEVICE

CROSS-REFERENCE TO RELATED APPLICATIONS

This application is the U.S. national phase of PCT Application No. PCT/CN2016/100765 filed on Sep. 29, 2016, which claims priority to Chinese Patent Application No. 201511029910.3 filed on Dec. 31, 2015, the disclosures of which are incorporated in their entirety by reference herein.

TECHNICAL FIELD

The present disclosure relates to the field of display device, in particular to an array substrate motherboard, an array substrate acquired by cutting the array substrate motherboard, a method of manufacturing the same, and a display device including the array substrate.

BACKGROUND

Usually, a large array substrate board is manufactured and then cut into a plurality of array substrates, so as to facilitate the manufacture and reduce the manufacturing steps.

Figure 1:
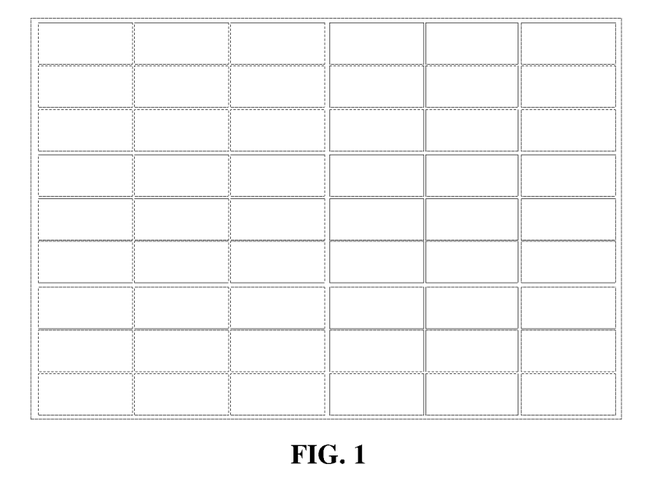
FIG. 1 is a schematic view showing an arrangement of array substrates in an array substrate motherboard.

As shown in FIG. 1, which is a schematic view showing the arrangement of the array substrates in the array substrate motherboard, a blank portion of a certain width exists between any two adjacent array substrates, and it may be discarded after the cutting process.

SUMMARY

An object of the present disclosure is to provide an array substrate motherboard, an array substrate, a method of manufacturing the same, and a display device, so as to cut the array substrate motherboard without any waste and improve the material utilization.

To this end, in one aspect, the present disclosure provides in some embodiments an array substrate motherboard, including a plurality of array regions, each array region including a fan-out region, a display region and a sealant arrangement region between the fan-out region and the display region. The array substrate motherboard further includes a plurality of testing line regions arranged in one-to-one correspondence with the plurality of array regions. A plurality of testing buses is arranged at the testing line region at different layers, and each testing bus corresponds to a group of testing lines formed integrally with the testing bus. The fan-out region includes a connection region arranged adjacent to the testing line region and a binding region arranged adjacent to the sealant arrangement region. One group of testing lines extends across the connection region to the binding region. Connection lines and connection members are arranged at the connection region at positions corresponding to remaining groups of testing lines. An end of each connection member is electrically connected to a corresponding testing line through a first via-hole, and an opposite end of the connection member is electrically connected to a corresponding connection line through a second via-hole. Each connection line extends toward the binding region.

In a possible embodiment of the present disclosure, the connection lines are arranged at a same layer and made of a same material as the group of testing lines extending across the connection region to the binding region.

In a possible embodiment of the present disclosure, projections of the testing lines at different layers onto a substrate of the array substrate motherboard are arranged alternately.

In a possible embodiment of the present disclosure, two testing buses are arranged at each testing line region, one of which is arranged at a same layer as data lines at the display region, and a remaining one of which is arranged at a same layer as gate lines at the display region.

In a possible embodiment of the present disclosure, the group of testing lines corresponding to the testing bus arranged at a same layer as the data lines is electrically connected to the data lines in odd columns or in even columns, and the group of testing lines corresponding to the testing bus arranged at a same layer as the gate lines is electrically connected to the data lines in even columns or in odd columns.

In a possible embodiment of the present disclosure, the connection members are arranged at a same layer and made of a same material as transparent electrodes.

In a possible embodiment of the present disclosure, the array substrate motherboard is divided into a plurality of cutting regions, each cutting region includes one of the array regions and one of the testing line regions, the testing line region and the fan-out region of the array region are arranged at two sides of the display region of the array region respectively, and no gap is provided between any two adjacent cutting regions.

In another aspect, the present disclosure provides in some embodiments an array substrate including a fan-out region, a testing line region and a display region. The fan-out region and the testing line region are arranged at two opposite sides of the display region respectively, and a sealant arrangement region is arranged between the fan-out region and the display region. The array substrate further includes a plurality of testing buses arranged at the testing line region at different layers, and each testing bus corresponds to a group of first testing lines. Each group of first testing lines is formed integrally with the testing bus corresponding to the group of first testing lines. The fan-out region includes a connection region and a binding region arranged between the connection region and the sealant arrangement region. A plurality of groups of second testing lines is arranged at the fan-out region at different layers. One group of second testing lines extends across the connection region to the binding region. Connection lines and connection members are arranged at the connection region at positions corresponding to remaining groups of second testing lines. An end of each connection member is electrically connected to a corresponding group of second testing lines through a first via-hole, and an opposite end of the connection member is electrically connected to a corresponding connection line through a second via-hole. Each connection line extends to the binding region.

In a possible embodiment of the present disclosure, projections of the testing lines at different layers onto a substrate of an array substrate motherboard are arranged alternately.

In a possible embodiment of the present disclosure, two testing buses are arranged at each testing line region, one of which is arranged at a same layer as data lines at the display region, and a remaining one of which is arranged at a same layer as gate lines at the display region.

In a possible embodiment of the present disclosure, the connection line is arranged at a same layer and made of a same material as the group of second testing lines extending across the connection region to the binding region.

In yet another aspect, the present disclosure, the present disclosure provides in some embodiments a display device including the above-mentioned array substrate and sealant surrounding the display region. A part of the sealant is arranged at the sealant arrangement region.

In still yet another aspect, the present disclosure provides in some embodiments a method for manufacturing an array substrate, including steps of forming an array substrate motherboard and cutting the array substrate motherboard into a plurality of cutting regions, so as to acquire a plurality of array substrates. The step of forming the array substrate motherboard includes: providing a base substrate which is divided into a plurality of array regions and a plurality of testing line regions arranged in one-to-one correspondence with the plurality of array regions, each array region being divided into a fan-out region, a display region and a sealant arrangement region arranged between the fan-out region and the display region, the fan-out region in each array region including a connection region arranged adjacent to the testing line region and a binding region arranged adjacent to the sealant arrangement region; forming a plurality of groups of testing patterns at different layers that are spaced and insulated from each other, each group of testing patterns including a testing bus and a group of testing lines formed integrally with the testing bus, one group of testing lines in one group of testing patterns extending across the connection region to the binding region, and the testing lines in remaining groups of testing patterns not extending to the binding region; forming a pattern including a plurality of connection lines arranged at the connection region and arranged in one-to-one correspondence with the testing lines not extending to the binding region; forming an insulation layer covering the pattern including the plurality of connection lines; forming a plurality of groups of first via-hole and second via-hole penetrating through the insulation layer, each connection line corresponding to one group of first via-hole and second via-hole, the first via-hole being arranged above the corresponding group of testing lines, and the second via-hole being arranged above the corresponding connection line; and forming a pattern including a plurality of connection members arranged in one-to-one correspondence with the plurality of connection lines. Each cutting region includes one of the array regions and one of the testing line regions, and the testing line region and the fan-out region of the array region are arranged at two sides of the display region of the array region respectively.

In a possible embodiment of the present disclosure, the step of forming the pattern including the plurality of connection lines is performed synchronously with the step of forming the group of testing patterns extending across the connection region to the binding region.

In a possible embodiment of the present disclosure, projections of the testing lines at different layers onto a substrate of the array substrate motherboard are arranged alternately.

In a possible embodiment of the present disclosure, the array substrate includes two testing buses, and the method further includes: forming a pattern including gate lines; and forming a pattern including data lines. The group of testing patterns including one of the testing buses is formed together with the data lines through a single patterning process, and the group of testing patterns including a remaining one of the testing buses is formed together with the gate lines through a single patterning process.

In a possible embodiment of the present disclosure, the testing lines in the group of testing patterns formed together with the pattern including the data lines through the single patterning process is electrically connected to the data lines in odd columns or in even columns, and the testing lines in the group of testing patterns formed together with the pattern including the gate lines through the single patterning process is electrically connected to the data lines in even columns or in odd columns.

In a possible embodiment of the present disclosure, the method further includes forming a pattern including transparent electrodes, and the step of forming the pattern including the plurality of connection members arranged in one-to-one correspondence with the plurality of connection lines is performed synchronously with the step of forming the pattern including the transparent electrodes.

In a possible embodiment of the present disclosure, no gap is provided between any two adjacent cutting regions.

In a possible embodiment of the present disclosure, the step of forming the connection lines is performed synchronously with a step of forming a pattern extending across the sealant arrangement region and a first connection region to a second connection region.

According to the array substrate motherboard in the embodiments of the present disclosure, there is no cutting gap between the two adjacent array substrates in the same column. In order to ensure a complete circuit of the array substrate and prevent a display circuit at the display region from being damaged, a current array substrate may include the testing line region of a next array substrate in the same column. In this way, it is possible increase the material utilization.

A plurality of separate array substrates is acquired after the cutting procedure, and each array substrate includes one testing line region where no via-hole is provided. In the event that the array substrate forms a display device with an opposite substrate, the sealant surrounds the display region, and a part of the sealant is arranged at the sealant arrangement region between the fan-out region and the display region. All the first via-holes and second via-holes are arranged outside the sealant and at positions far away from the sealant. The sealant may not be in contact with moisture from an external environment even in the event that the moisture enters the display device through the first via-holes and the second via-holes. As a result, it is possible to prevent the sealant from being corroded, thereby improving the yield of the display device.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In the drawings.

DETAILED DESCRIPTION

The present disclosure will be described hereinafter in conjunction with the drawings and embodiments. The following embodiments are for illustrative purposes only, but shall not be used to limit the scope of the present disclosure.

In order to improve the material utilization, the present disclosure provides in some embodiments an array substrate motherboard on which no gap is provided between any two adjacent array substrates. Hence, in case of cutting the array substrate motherboard into array substrates, no waste of material may occur.

To be specific, the array substrate motherboard includes a plurality of array regions, and each array region includes a fan-out region, a display region and a sealant arrangement region between the fan-out region and the display region. The array substrate motherboard further includes a plurality of testing line regions arranged in one-to-one correspondence with the plurality of array regions. A plurality of testing buses is arranged at the testing line region at different layers, and each testing bus corresponds to a group of testing lines. The fan-out region includes a connection region arranged adjacent to the testing line region and a binding region arranged adjacent to the sealant arrangement region.

Figure 2:
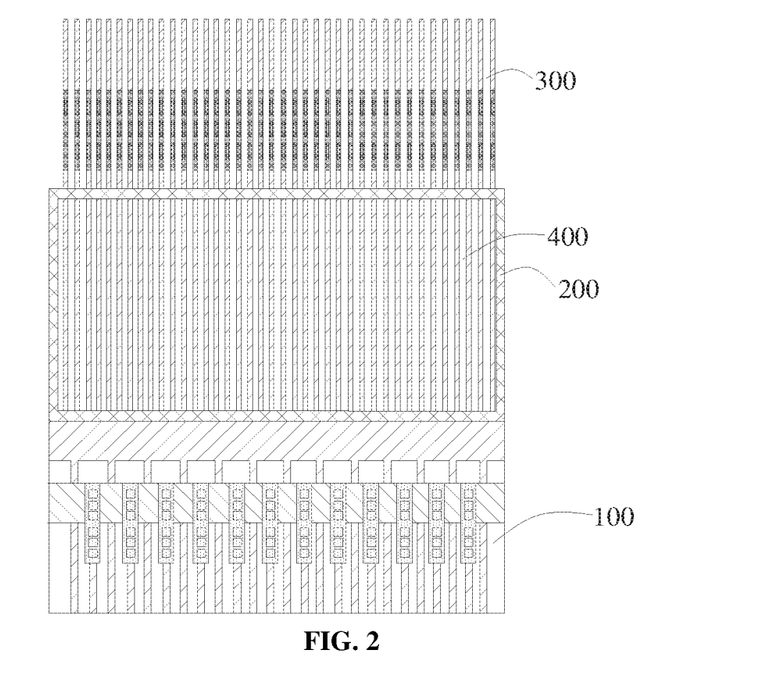
FIG. 2 is a schematic view showing a display device according to the embodiments of the present disclosure.

No cutting gap is provided between two adjacent array substrates in the same column, and in order to ensure a complete circuit of the array substrate and prevent a display circuit at the display region from being damaged, in a possible embodiment of the present disclosure, a current array substrate may include a testing line region 100 of a next array substrate in the same column. To be specific, as shown in FIG. 2, after the cutting process, the testing line region 100 is arranged at a side of the array substrate, and sealant 200 surrounding a display region 400 is arranged at an inner side of the testing line region (i.e., at a side of the testing line region close to the display region). A fan-out region 300 is arranged at the other side of the array substrate, and functions to receive a display signal. Before cutting the array substrate motherboard into the array substrates, a testing signal may be applied via the testing line region to an array substrate adjacent to the array substrate where the testing line region 100 is arranged.

Figure 3:
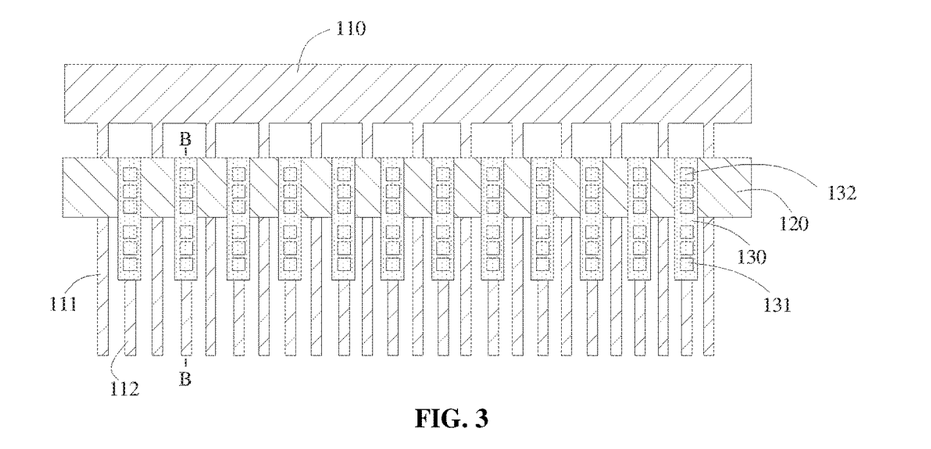
FIG. 3 is an enlarged view of a portion of a testing line region in FIG. 2.

As shown in FIG. 3, which is an enlarged view of a portion of the testing line region in the display device in FIG. 2, the testing line region includes a first testing bus 110 and a second testing bus 120 arranged at different layers. The first testing bus 110 corresponds to a group of testing lines 111 which is arranged at a same layer as, and formed integrally with, the first testing bus 110. The second testing bus 120 corresponds to a group of testing lines 112 which is arranged at a same layer as the first testing bus 110 and, as shown in FIG. 3, electrically connected to the second testing bus 120 via a connection member 130 and via-holes 131, 132.

Figure 4:
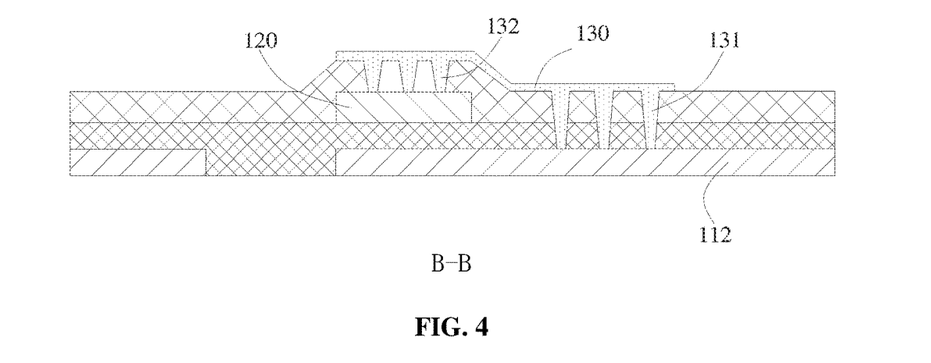
FIG. 4 is a sectional view along line B-B in FIG. 3.
Figure 5:
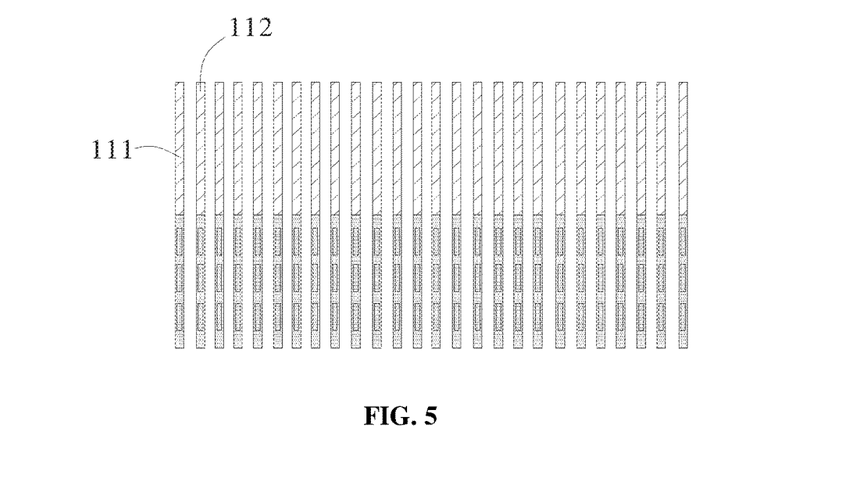
FIG. 5 is an enlarged view of a fan-out region in FIG. 2.

As mentioned above, no gap is between the two adjacent array substrates in the array substrate motherboard, so usually one array substrate is provided with one testing line region. The sealant 200 is arranged at the inner side of the testing line region and surrounds the display region 400. It should be appreciated that, in the display device, the testing line region 100 may take no effect. As shown in FIGS. 3 and 4, the testing lines 112 and the connection member 130 are connected to the second testing bus via the via-holes 131, 132. FIG. 5 shows a portion of the fan-out region. The testing lines 111 and the testing lines 112 extend to the fan-out region, and are connected to data lines at the display region through the connection member.

In the event that the display device has the structure as shown in FIG. 2, it is possible to cut the array substrate motherboard without any waste. However, in the case of testing the display device as shown in FIG. 2, it is found that the sealant of the display device is more likely to be damaged after a certain period.

Through researches, inventors of the present application find the reasons why the sealant in the display device as shown in FIG. 2 is corroded, which will be described hereinafter in conjunction with FIG. 4.

As shown in FIG. 4, at the testing line region, moisture from an external environment may easily enter the via-hole 131 and thereby corrode the testing lines at the bottom of the via-hole 131. The testing lines are metal lines, and an alkaline liquid may be produced after the corrosion. This alkaline liquid may corrode the sealant and bubbles may occur, so an imperfect product may be acquired.

Figure 9:
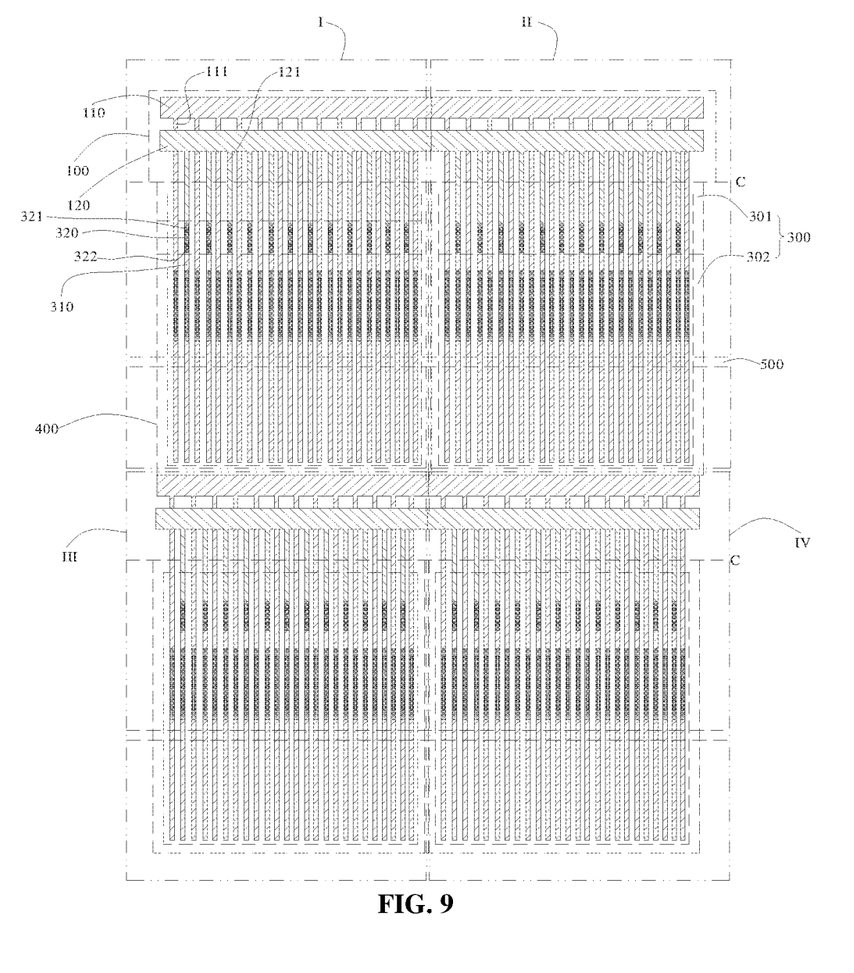
FIG. 9 is a schematic view showing an array substrate motherboard provided by the embodiments of the present disclosure.

Hence, as shown in FIG. 9, the present disclosure provides in some embodiments an array substrate motherboard, which includes a plurality of array regions (i.e., array region I, array region II, array region III and array region IV as shown in FIG. 9). Each array region includes a fan-out region 300, a display region 400, and a sealant arrangement region 500 arranged between the fan-out region 300 and the display region 400. The array substrate motherboard further includes a plurality of testing line regions 100 arranged in one-to-one correspondence with the plurality of array regions. A plurality of testing buses (i.e., a first testing bus 110 and a second testing bus 120 in FIG. 9) is arranged at the testing line region 100 at different layers, and each testing bus corresponds to a group of testing lines (i.e., in FIG. 9, the first testing bus 110 corresponds to testing lines 111 and the second testing bus 120 corresponds to testing lines 121). The fan-out region 300 includes a connection region 301 arranged adjacent to the testing line region 100 and a binding region 302 arranged adjacent to the sealant arrangement region 500. One group of testing lines (i.e., the testing lines 111 in FIG. 9) extends across the connection region 301 to the binding region 302. Connection lines 310 and connection members 320 are arranged at the connection region 301 at positions corresponding to the remaining groups of testing lines (i.e., the testing lines 121 in FIG. 9). In other words, in the remaining groups of testing lines, each testing line corresponds to one connection line 310 and one connection member 320. One end of each connection member 320 is electrically connected to a corresponding testing line through a first via-hole 321, and the other end of the connection member 320 is electrically connected to a corresponding connection line 310 through a second via-hole. Each connection line 310 extends to the binding region 302.

It should be appreciated that, a data pad may be arranged at the binding region. The structure of the data pad is already known in the art, and thus will not be repeated herein.

It should be further appreciated that, for ease of observation and explanation, in FIG. 9, the fan-out region 300 and the testing line region 100 are each of a relatively large area while the display region 400 is of a relatively small area. However, actually the display region 400 is of an area larger than the fan-out region 300 and the testing line region 100.

Figure 7:
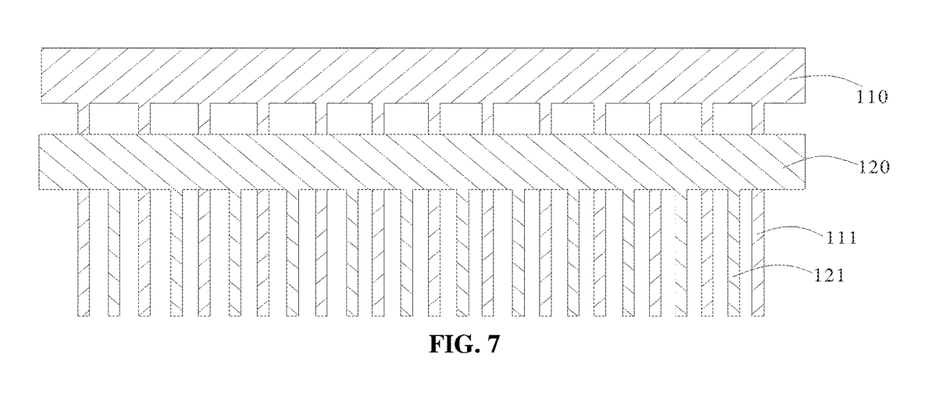
FIG. 7 is an enlarged view of a portion of the testing line region in FIG. 3.

FIG. 7 shows a portion of the testing line region 100. In FIGS. 7 and 9, two testing buses, i.e., the first testing bus 110 and the second testing bus 120, are arranged at each testing line region. The first testing bus 110 corresponds to a group of testing lines 111, and the group of testing lines 111 is arranged at a same layer as, and formed through a single patterning process together with, the first testing bus 110. The second testing bus 120 corresponds to a group of testing lines 121, and the group of testing lines 121 is arranged at a same layer as, and formed through a single patterning process together with, the second testing bus 120.

Figure 8:
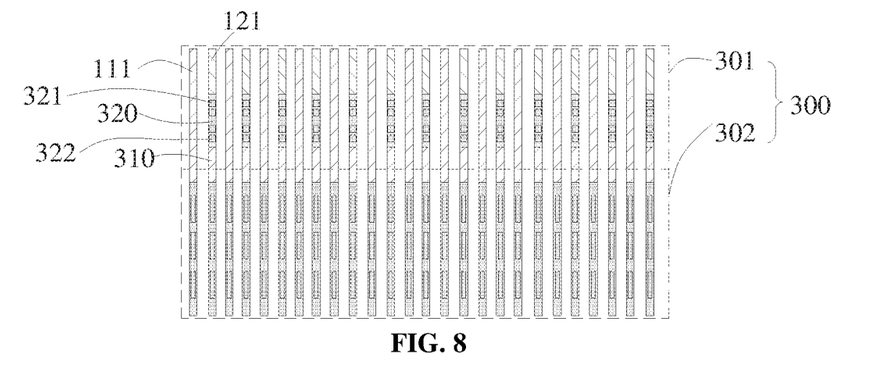
FIG. 8 is a schematic view showing a cancellation region in FIG. 6.

FIG. 8 shows a portion of the fan-out region. As shown in FIG. 8, each testing line 111 extends across the connection region 301 to the binding region 302. The testing lines 121 are merely arranged at the connection region 301. The connection line 310 is arranged at the connection region 301 at a position corresponding to each testing line 121. One end of the connection member 320 is electrically connected to the corresponding testing line 121 through the first via-hole 321, and the other end of the connection member 320 is electrically connected to the connection line 310 through the second via-hole 322.

Figure 6:
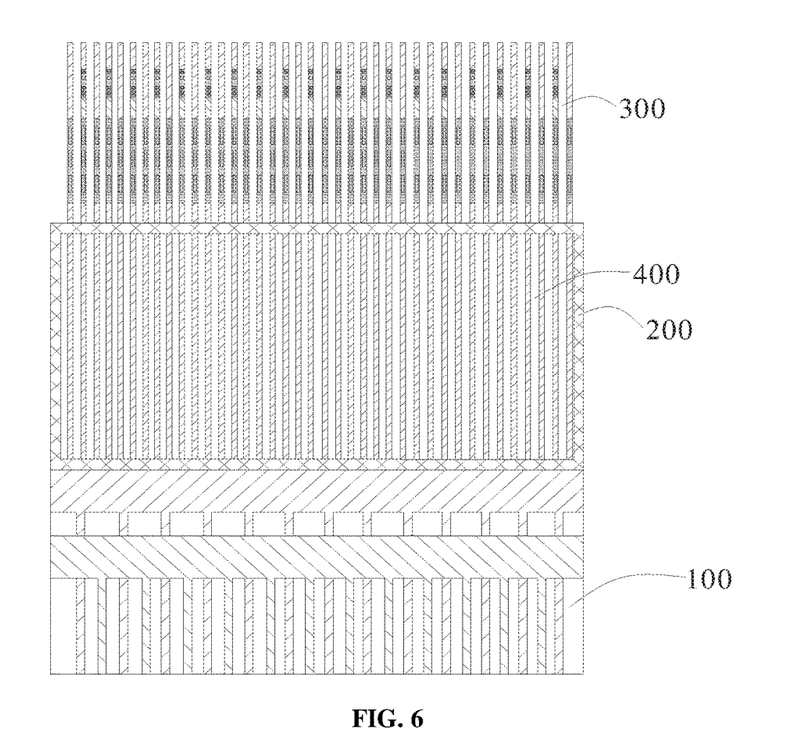
FIG. 6 is another schematic view showing the display device according to the embodiments of the present disclosure.

In the array substrate motherboard in FIG. 9, no cutting gap is provided between the two adjacent array substrates in the same column. In order to ensure a complete circuit of the array substrate and prevent a display circuit at the display region from being damaged, in a possible embodiment of the present disclosure, a current array substrate may include the testing line region 100 of a next array substrate in the same column. After the array substrate motherboard is cut along a transverse cutting line C in FIG. 9, a testing line region of each array region is arranged at a side of a display region of an array substrate adjacent to the array region. After the cutting process, a plurality of separate array substrate may be acquired. In addition, as shown in FIG. 6, each array substrate is provided with one testing line region 100, in which no via-hole is formed. In the event that the array substrate forms the display device with an opposite substrate, the sealant 200 may surround the display region 400, and a part of the sealant 200 may be arranged at the sealant arrangement region between the fan-out region 300 and the display region 400. All the first via-holes 321 and second via-holes 322 are arranged outside the sealant 200, and at positions far away from the sealant. Even in the event that the moisture from the external environment enters the first via-holes 321 and the second via-holes 322, it may not reach the sealant 200. In this way, it is possible to prevent the sealant 200 from being corroded, thereby to improve the yield of the display device.

It should be appreciated that, all the testing lines at each testing line region may be arranged in one-to-one correspondence with all the data lines at the display region, and each testing line is used to provide a testing signal to the corresponding data line.

For convenience, in a possible embodiment of the present disclosure, the connection line at the fan-out region 300 is merely arranged at a same layer as the testing line extending across the connection region 301 to the binding region 302. In FIG. 8, the connection line 310 is arranged at a same layer as the testing line 111.

In a possible embodiment of the present disclosure, projections of the testing lines at different layers onto a substrate of the array substrate motherboard are arranged alternately. In this way, a relatively large gap is arranged between the testing lines at an identical layer, so as to prevent the occurrence of such defects as short-circuit. In addition, the denser the testing lines are, the more stringent the requirement on a patterning device for forming the testing lines is. In the embodiments of the present disclosure, in the event that the large gap is provided between the testing lines at the same layer, it is possible to further reduce the requirement on the precision of the patterning device.

The above description is given by taking two testing buses at each testing line region as an example, but it should be appreciated that the present disclosure is not limited thereto.

In a possible embodiment of the present disclosure, in the event that two testing buses are arranged at each testing line region 100, for ease of manufacture, one of the two testing buses is arranged at a same layer as the data lines at the display region 400, and the other one is arranged at a same layer as the gate lines at the display region 400.

To be specific, the first testing bus 110 may be arranged at a same layer as the data lines, and the second testing bus 120 may be arranged at a same layer as the gate lines. Hence, the data lines and the first testing bus 110 may be formed through a single patterning process, and the gate lines and the second testing bus 120 may be formed through a single patterning process.

In a possible embodiment of the present disclosure, the testing lines corresponding to the testing bus arranged at the same layer as the data lines are electrically connected to the data lines in odd columns or in even columns, and the testing lines corresponding to the testing bus arranged at the same layer as the gate lines are electrically connected to the data lines in even columns or in odd columns.

In order to reduce process steps, in a possible embodiment of the present disclosure, the connection member 320 is arranged at a layer, and made of a material, identical to transparent electrodes. For example, the connection member 320 and the transparent electrodes 320 may be made of indium tin oxide (ITO). In the event that the array substrate is applied to a liquid crystal display device, the transparent electrode may be a pixel electrode or a common electrode. In the event that the array substrate is applied to an organic light-emitting diode display device, the transparent electrode may be an anode or cathode of an organic light-emitting diode.

The array substrate motherboard may be cut without any waste, so it may be divided into a plurality of cutting regions. Each cutting region includes one array region and one testing line region. The testing line region and the fan-out region of the array substrate are arranged at two sides of the display region of the array substrate respectively, and no gap is provided between any two adjacent cutting regions. After the separation of the plurality of cutting regions, a plurality of separate array substrates may be obtained.

Figure 10:
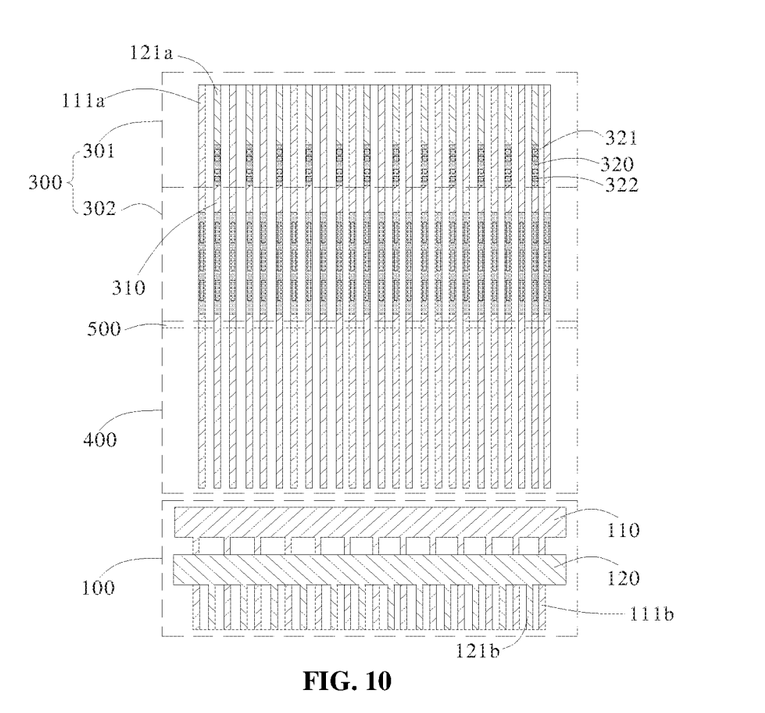
FIG. 10 is a schematic view showing an array substrate according to the embodiments of the present disclosure.

In another aspect of the present disclosure, the present disclosure further provides in some embodiments an array substrate acquired by cutting the above-mentioned array substrate motherboard. To be specific, as shown in FIG. 10, the array substrate includes a fan-out region 300, a testing line region 100 and a display region 400. The fan-out region 300 and the testing line region 100 are arranged at two opposite sides of the display region 400 respectively, and a sealant arrangement region 500 is arranged between the fan-out region 300 and the display region 400. The array substrate further includes a plurality of testing buses (i.e., a first testing bus 110 and a second testing bus 120 in FIG. 10) at the testing line region 110 at different layers. Each testing bus corresponds to a group of first testing lines (i.e., a first testing line 111b and a first testing line 121b in FIG. 10), and each group of first testing lines is formed integrally with the testing bus corresponding thereto. The fan-out region 300 includes a connection region 301 and a binding region 302 arranged between the connection 301 and the sealant arrangement region 500. A plurality of groups of second testing lines (i.e., a second testing line 111a and a second testing line 121a) is arranged at the fan-out region 300 at different layers. One group of second testing lines (second testing line 111a in FIG. 10) extends across the connection region 301 to the binding region 302. Connection lines 310 and corresponding connection members 320 are arranged at the connection region 301 at positions corresponding to the remaining groups of second testing lines. One end of each connection member 320 is electrically connected to a corresponding second testing line (i.e., the second testing line 121a in FIG. 10) through a first via-hole 321, and the other end is electrically connected to the corresponding connection line 310 through a second via-hole 322. Each connection line extends to the binding region.

It should be appreciated that, in the array substrate in the embodiments of the present disclosure, the testing buses and the first testing lines at the testing line region 100 are not used to provide a testing signal to the array substrate, but to provide a testing signal to an array substrate adjacent to the array substrate on the array substrate motherboard. After the array substrate motherboard is cut into a plurality of separate array substrates, the first testing lines do not work anymore.

In the event that the array substrate forms a display device with the opposite substrate, the sealant may surround the display region 400, and a part of the sealant may be arranged at the sealant arrangement region. Hence, all the first via-holes 321 and the second via-holes 322 are arranged outside the sealant at positions far away from the sealant. Even in the event that the moisture from the external environment enters the first via-holes 321 and the second via-holes 322, it may not reach the sealant. As a result, it is possible to prevent the sealant from being corroded, thereby improving the yield of the display device.

As mentioned above, in a possible embodiment of the present disclosure, projections of the testing lines at different layers onto a substrate of the array substrate motherboard may be arranged alternately. Hence, at the same layer, a relatively large gap may be provided between two adjacent testing lines, so as to reduce the requirement on the precision of the patterning device, thereby reducing the manufacturing costs of the array substrate.

In order to reduce the process steps, in a possible embodiment of the present disclosure, two testing buses may be arranged at each testing line region. One of the two testing buses may be arranged at the same layer as data lines of the array substrate, and the other may be arranged at the same layer as gate lines of the array substrate.

In order to further reduce the process steps, in a possible embodiment of the present disclosure, the connection line may be arranged at the same layer and made of the same material as the group of second testing lines extending across the connection region to the binding region.

In another aspect, the present disclosure further provides in some embodiments a display device including the above-mentioned array substrate and a sealant surrounding the display region. A part of the sealant is arranged at the sealant arrangement region.

As shown in FIG. 6, a part of the sealant is arranged at the sealant arrangement region in the display device, so all the first via-holes and second via-holes are arranged outside the sealant and at positions far away from the sealant. Even in the event that the moisture from the external environment enters the first via-holes 321 and the second via-holes 22, it may not reach the sealant. As a result, it is possible to prevent the sealant from being corroded, thereby improving the yield of the display device.

In the embodiments of the present disclosure, the display device may be any electronic device, such as a display panel, a mobile phone, a flat-panel computer or a television.

In yet another aspect, the present disclosure further provides in some embodiments a method for manufacturing an array substrate, including steps of forming an array substrate motherboard including a plurality of array regions and cutting the array substrate motherboard into a plurality of cutting regions, so as to acquire a plurality of array substrates. The step of forming the array substrate motherboard includes: providing a base substrate which is divided into a plurality of array regions and a plurality of testing line regions arranged in one-to-one correspondence with the plurality of array regions, each array region being divided into a fan-out region, a display region and a sealant arrangement region arranged between the fan-out region and the display region, the fan-out region including a connection region arranged adjacent to the testing line region and a binding region arranged adjacent to the sealant arrangement region; forming a plurality of groups of testing patterns at different layers which are spaced and insulated from each other, each group of testing patterns including a testing bus and a group of testing lines formed integrally with the testing bus, one group of testing lines included in one group of testing patterns extending across the connection region to the binding region, and the groups of testing lines included in the remaining groups of testing patterns not extending to the binding region; forming a pattern including a plurality of connection lines arranged at the connection region and arranged in one-to-one correspondence with the plurality of groups of testing lines not extending to the binding region; forming an insulation layer covering the pattern including the plurality of connection lines; forming a plurality of groups of first via-hole and second via-hole penetrating through the insulation layer, each connection line corresponding to one group of first via-hole and second via-hole, the first via-hole being arranged above the corresponding group of testing lines, and the second via-hole being arranged above the corresponding connection line; forming a pattern including a plurality of connection members arranged in one-to-one correspondence with the plurality of connection lines. Each cutting region includes one of the array regions and one of the testing line regions, and the testing line region and the fan-out region of the array region are arranged at two sides of the display region of the array region respectively.

Through the above-mentioned method, it is possible to acquire the array substrate in the embodiments of the present disclosure and, as mentioned above, improve the yield of the array substrate.

In order to simplify the manufacture and reduce the thickness of the array substrate, in a possible embodiment of the present disclosure, the step of forming the pattern including the plurality of connection lines is performed synchronously with the step of forming the group of testing patterns extending across the connection region to the binding region.

In a possible embodiment of the present disclosure, projections of the testing lines at different layers onto a substrate of the array substrate motherboard are arranged alternately, so as to provide a relatively large gap between two adjacent testing lines at the same layer. As a result, it is possible to reduce the requirement on the precision of the patterning device, and prevent the occurrence of such defects as short circuit between the testing lines at the same layer.

In a possible embodiment of the present disclosure, the array substrate includes two testing buses, and the method further includes: forming a pattern including gate lines; and forming a pattern including data lines. The group of testing patterns including one of the testing buses is formed together with the data lines through a single patterning process, and the group of testing patterns including the other one of the testing buses is formed together with the gate lines through a single patterning process.

In order to simplify the manufacture, in a possible embodiment of the present disclosure, the group of testing lines corresponding to the group of testing patterns formed together with the pattern including the data lines through a single patterning process is electrically connected to the data lines in odd columns or in even columns, and the group of testing lines corresponding to the group of testing patterns formed together with the pattern including the gate lines through a single patterning process is electrically connected to the data lines in even columns or in odd columns.

In a possible embodiment of the present disclosure, the method further includes forming a pattern including transparent electrodes, and the step of forming the pattern including the plurality of connection members arranged in one-to-one correspondence with the plurality of connection lines is performed synchronously with the step of forming the pattern including the transparent electrodes.

In the event that the array substrate is applied to a liquid crystal display device, the transparent electrode may be a pixel electrode or a common electrode. In the event that the array substrate is applied to an organic light-emitting diode display device, the transparent electrode may be an anode or a cathode of an organic light-emitting diode.

In a possible embodiment of the present disclosure, no gap is provided between any two adjacent cutting regions. In this way, it is possible to manufacture the array substrate without any waste, thereby reducing the use of the material.

In order to simplify the manufacture, in a possible embodiment of the present disclosure, the step of forming the connection lines is performed synchronously with a step of forming a pattern extending across the sealant arrangement region and a first connection region to a second connection region.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method of manufacturing an array substrate, comprising steps of:
    forming an array substrate motherboard; and
    cutting the array substrate motherboard into a plurality of cutting regions, so as to acquire a plurality of array substrates,
    wherein the step of forming the array substrate motherboard comprises:
        providing a base substrate that is divided into a plurality of array regions and a plurality of testing line regions arranged in one-to-one correspondence with the plurality of array regions, each array region being divided into a fan-out region, a display region and a sealant arrangement region arranged between the fan-out region and the display region, the fan-out region in each array region comprising a connection region arranged adjacent to the testing line region and a binding region arranged adjacent to the sealant arrangement region;
        forming a plurality of groups of testing patterns at different layers that are spaced and insulated from each other, each group of testing patterns comprising a testing bus and a group of testing lines formed integrally with the testing bus, one group of testing lines in one group of testing patterns extending across the connection region to the binding region, and the testing lines in remaining groups of testing patterns not extending to the binding region;
        forming a pattern comprising a plurality of connection lines arranged at the connection region and arranged in one-to-one correspondence with the testing lines not extending to the binding region;
        forming an insulation layer covering the pattern comprising the plurality of connection lines;
        forming a plurality of groups of first via-hole and second via-hole penetrating through the insulation layer, each connection line corresponding to one group of first via-hole and second via-hole, the first via-hole being arranged above the corresponding group of testing lines, and the second via-hole being arranged above the corresponding connection line; and
        forming a pattern comprising a plurality of connection members arranged in one-to-one correspondence with the plurality of connection lines, and
    each cutting region comprises one of the array regions and one of the testing line regions, and the testing line region and the fan-out region of the array region are arranged at two sides of the display region of the array region respectively.

2. The method according to claim 1, further comprising forming a pattern including transparent electrodes, wherein the step of forming the pattern comprising the plurality of connection members arranged in one-to-one correspondence with the plurality of connection lines is performed synchronously with the step of forming the pattern comprising the transparent electrodes.

3. The method according to claim 1, wherein the step of forming the pattern comprising the plurality of connection lines is performed synchronously with the step of forming the group of testing patterns extending across the connection region to the binding region.

4. The method according to claim 1, wherein projections of the testing lines at different layers onto a substrate of the array substrate motherboard are arranged alternately.

5. The method according to claim 1, wherein no gap is provided between any two adjacent cutting regions.

6. The method according to claim 1, wherein the array substrate comprises two testing buses,
    the method further comprises forming a pattern comprising gate lines, and forming a pattern comprising data lines, and
    the group of testing patterns comprising one of the testing buses is formed together with the data lines through a single patterning process, and the group of testing patterns comprising a remaining one of the testing buses is formed together with the gate lines through a single patterning process.

7. The method according to claim 6, wherein the testing lines in the group of testing patterns formed together with the pattern comprising the data lines through the single patterning process is electrically connected to the data lines in odd columns or in even columns, and the testing lines in the group of testing patterns formed together with the pattern comprising the gate lines through the single patterning process is electrically connected to the data lines in even columns or in odd columns.

8. An array substrate motherboard, comprising a plurality of array regions, each array region comprising a fan-out region, a display region and a sealant arrangement region between the fan-out region and the display region,
wherein the array substrate motherboard further comprises a plurality of testing line regions arranged in one-to-one correspondence with the plurality of array regions;
a plurality of testing buses is arranged at the testing line region at different layers, and each testing bus corresponds to a group of testing lines formed integrally with the testing bus;
the fan-out region comprises a connection region arranged adjacent to the testing line region and a binding region arranged adjacent to the sealant arrangement region;
one group of testing lines extends across the connection region to the binding region;
connection lines and connection members are arranged at the connection region at positions corresponding to remaining groups of testing lines;
an end of each of the connection members is electrically connected to a corresponding testing line through a first via-hole, and an opposite end of each of the connection members is electrically connected to a corresponding connection line through a second via-hole; and
each of the connection lines extends toward the binding region.

9. The array substrate motherboard according to claim 1, wherein the array substrate motherboard is divided into a plurality of cutting regions, each cutting region comprises one of the array regions and one of the testing line regions, the testing line region and the fan-out region of the array region are arranged at two sides of the display region of the array region respectively, and no gap is provided between any two adjacent cutting regions.

10. The array substrate motherboard according to claim 8, wherein projections of the testing lines at different layers onto a substrate of the array substrate motherboard are arranged alternately.

11. The array substrate motherboard according to claim 1, wherein the connection members are arranged at a same layer and made of a same material as transparent electrodes.

12. The array substrate motherboard according to claim 8, wherein the connection lines are arranged at a same layer and made of a same material as the group of testing lines extending across the connection region to the binding region.

13. The array substrate motherboard according to claim 12, wherein two testing buses are arranged at each testing line region, one of which is arranged at a same layer as data lines at the display region, and a remaining one of which is arranged at a same layer as gate lines at the display region.

14. The array substrate motherboard according to claim 13, wherein the group of testing lines corresponding to the testing bus arranged at a same layer as the data lines is electrically connected to the data lines in odd columns or in even columns, and the group of testing lines corresponding to the testing bus arranged at a same layer as the gate lines is electrically connected to the data lines in even columns or in odd columns.

15. An array substrate, comprising a fan-out region, a testing line region and a display region, the fan-out region and the testing line region being arranged at two opposite sides of the display region respectively, and a sealant arrangement region being arranged between the fan-out region and the display region,
wherein the array substrate further comprises a plurality of testing buses arranged at the testing line region at different layers, and each testing bus corresponds to a group of first testing lines;
each group of first testing lines is formed integrally with the testing bus corresponding to the group of first testing lines;
the fan-out region comprises a connection region and a binding region arranged between the connection region and the sealant arrangement region;
a plurality of groups of second testing lines is arranged at the fan-out region at different layers;
one group of second testing lines extends across the connection region to the binding region;
connection lines and connection members are arranged at the connection region at positions corresponding to remaining groups of second testing lines;
an end of each connection member is electrically connected to a corresponding group of second testing lines through a first via-hole, and an opposite end of the connection member is electrically connected to a corresponding connection line through a second via-hole; and
each of the connection lines extends to the binding region.

16. The array substrate according to claim 15, wherein two testing buses are arranged at each testing line region, one of which is arranged at a same layer as data lines at the display region, and a remaining one of which is arranged at a same layer as gate lines at the display region.

17. The array substrate according to claim 15, wherein the connection line is arranged at a same layer and made of a same material as the group of second testing lines extending across the connection region to the binding region.

18. A display device, comprising the array substrate according to claim 15 and sealant surrounding the display region, wherein a part of the sealant is arranged at the sealant arrangement region.

19. The array substrate according to claim 15, wherein projections of the testing lines at different layers onto a substrate of an array substrate motherboard are arranged alternately.

* * * * *